United States Patent
Ozaki

(10) Patent No.: US 6,389,580 B1
(45) Date of Patent: May 14, 2002

(54) COMPUTER READABLE STORAGE MEDIUM HAVING LOGIC SYNTHESIS PROGRAM, AND LOGIC SYNTHESIS METHOD AND APPARATUS

(75) Inventor: Masaru Ozaki, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/328,791

(22) Filed: Jun. 9, 1999

(30) Foreign Application Priority Data

Dec. 22, 1998 (JP) .......................................... 10-365691

(51) Int. Cl.[7] .............................................. G06F 17/50
(52) U.S. Cl. ............................. 716/6; 716/18; 327/105
(58) Field of Search ................................. 716/1, 3, 4, 6, 716/18, 16; 703/13, 15, 19; 724/726, 724; 327/105–197

(56) References Cited

U.S. PATENT DOCUMENTS

| 5,656,959 A | * | 8/1997 | Chang et al. | ................. 327/105 |
| 5,956,256 A | * | 9/1999 | Rezek et al. | ................. 364/489 |

FOREIGN PATENT DOCUMENTS

| JP | 3-182969 | 8/1991 |
| JP | 6-251104 | 9/1994 |
| JP | 10-187787 | 7/1998 |

* cited by examiner

Primary Examiner—Matthew Smith
Assistant Examiner—Calvin Lee
(74) Attorney, Agent, or Firm—Burns, Doane, Swecker & Mathis, LLP

(57) ABSTRACT

A computer readable storage medium has a logic synthesis code embodied therein. The logic synthesis code includes a standard design function for causing a computer to generate standard circuit information about target circuitry on which a logic synthesis function is to be performed, based on specifications of the target circuitry written in a hardware description language, the standard circuit information logically matching the specifications; a timing design function for causing the computer to generate modified circuit information by modifying the standard circuit information so that the standard circuit information satisfies both an ideal clock signal condition defining an ideal clock signal to be applied to one or more sequential circuits included in target circuitry, and at least either of a first ideal assertion period condition defining an ideal period of time during which each of one or more tristate buffers included in the target circuitry is asserted and a second ideal assertion period condition defining an ideal period of time during which each of one or more other sequential circuits for latching an output of a tristate buffer, which are included in the target circuitry is asserted; and an output function for outputting the modified circuit information from the timing design function.

20 Claims, 7 Drawing Sheets

COMPUTER READABLE STORAGE MEDIUM HAVING LOGIC SYNTHESIS PROGRAM, AND LOGIC SYNTHESIS METHOD AND APPARATUS

BACKGROUND OF THE INVENTION

1. Field of the Invention

The present invention relates to a computer readable storage medium having a logic synthesis program, and a logic synthesis method and a logic synthesis apparatus, for generating information about the constitution of desired logic circuitry, which is comprised of a plurality of pieces of cell information, based on specifications of the desired circuitry. More particularly, it relates to a computer readable storage medium having a logic synthesis program, and a logic synthesis method and a logic synthesis apparatus, capable of constituting desired logic circuitry using a tristate bus based on specifications of the desired circuitry.

2. Description of the Prior Art

Japanese Patent Application Publication (KOKAI) No. 3-182969, No. 6-251104, and No. 10-187787 disclose a prior art logic synthesis apparatus for generating information about the constitution of a desired circuit, which consists of a plurality of pieces of cell information, based on specifications of the desired circuit written in a hardware description language. Referring now to FIG. 12, there is illustrated a block diagram showing the structure of such a prior art logic synthesis apparatus. In the figure, reference numeral 1 denotes a central processing unit for performing a logic synthesis function, 2 denotes a memory for storing information required for the logic synthesis function and so on, 3 denotes an input unit, 4 denotes a display unit, 5 denotes an input/output (I/O) port, and 6 denotes a system bus. Further, reference numeral 7 denotes a cell library, 8 denotes specification information about specifications of desired circuitry on which the logic synthesis function is to be performed, written in a hardware description language or HDL, and 54 denotes information provided as timing limitations imposed on the desired circuitry on which the logic synthesis function is to be performed, i.e. information about timing of a clock signal to be applied to flip-flops and latches included in the circuitry.

In operation, the central processing unit 1 performs a logic analysis based on the specification information 8 read out of the memory 2 and then generates standard circuit information about the constitution of the desired circuitry. The central processing unit 1 then modifies the standard circuit information so that the standard circuit information satisfies the timing information 54 about the timing of the clock signal, which is read out of the memory 2, to generate modified circuit information that complies with the timing information. For example, the central processing unit 1 adjusts the driving capability of each of a plurality of components such as flip-flops, latches, and logic gates so that data transfer among them is completed in one clock cycle so as to generate modified circuit information, and then stores it in the memory 2.

A problem with such a prior art logic synthesis apparatus is that the mutual timing of signals applied to components that transmit and receive data using a tristate bus cannot be optimized because the timing limitations mainly include information about the timing of a clock signal applied to storage elements such as flip-flops and latches and therefore a control signal applied to a tristate buffer is assumed to be a kind of data signal. This can result in a undesired configuration of the target circuitry in which a unidirectional bus is provided for each of cells and sequential circuits that receives signals via the unidirectional bus and a selector is provided for each unidirectional bus in order for each cell or sequential circuit to furnish a signal via each unidirectional bus even though the circuitry can be constituted using a tristate bus that also serves as a bidirectional bus. As a result, the circuitry designed can have a number of unnecessary unidirectional buses, thus increasing in complexity and size.

SUMMARY OF THE INVENTION

The present invention is made to overcome the above problem. It is therefore an object of the present invention to provide a computer readable storage medium having a logic synthesis program, and a logic synthesis method and a logic synthesis apparatus, capable of optimizing the mutual timing of signals applied to components that transmit and receive data using a tristate bus, thus constituting desired circuitry using the tristate bus.

In accordance with one aspect of the present invention, there is provided a computer readable storage medium having a logic synthesis code embodied therein, the logic synthesis code comprising: a standard design function for causing a computer to generate standard circuit information about target circuitry on which a logic synthesis function is to be performed, based on specifications of the target circuitry written in a hardware description language, the standard circuit information logically matching the specifications; a timing design function for causing the computer to generate modified circuit information by modifying the standard circuit information so that the standard circuit information satisfies both an ideal clock signal condition defining an ideal clock signal to be applied to one or more sequential circuits included in the target circuitry, and at least either of a first ideal assertion period condition defining an ideal period of time during which each of one or more tristate buffers included in the target circuitry is asserted and a second ideal assertion period condition defining an ideal period of time during which each of one or more other sequential circuits for latching an output of a tristate buffer, which are included in the target circuitry is asserted; and an output function for outputting the modified circuit information from the timing design function.

In this specification, a sequential circuit is referred to as a circuit including either a flip-flop or a latch.

In accordance with a preferred embodiment of the present invention, the timing design function divides the standard circuit information into a plurality of pieces of standard circuit block information that are associated with a plurality of standard circuit blocks, respectively, while defining as boundaries one or more sequential circuits on which the ideal clock signal condition is imposed, and at least either of one or more tristate buffers on each of which the first ideal assertion period condition is imposed and one or more other sequential circuits on each of which the second ideal assertion period condition is imposed, and then modifies each of the plurality of pieces of standard circuit block information so that each of the plurality of pieces of standard circuit block information satisfies the ideal clock signal condition and at least either of the first and second ideal assertion period conditions. Furthermore, the output function causes the computer to furnish the modified circuit information including a combination of the plurality of pieces of modified standard circuit block information. The timing design function can cause the computer to modify one piece of standard circuit block information associated with one circuit block located between either a tristate buffer on which the first ideal assertion period condition is imposed or a sequential circuit on which the second ideal assertion period condition is imposed and another sequential circuit located upstream from either the tristate buffer or the former sequential circuit for furnishing a control signal to either the tristate buffer or the former sequential circuit in response to the clock signal so that the piece of standard circuit block information satisfies a maximum delay time condition defining a maximum value of a time delay to be provided to the control signal with respect to the clock signal.

In accordance with another preferred embodiment of the present invention, the timing design function causes the computer to generate the modified circuit information by modifying the standard circuit information so that the standard circuit information satisfies the ideal clock signal condition and the first and second ideal assertion period conditions. Preferably, the timing design function can divide the standard circuit information into a plurality of pieces of standard circuit block information that are associated with a plurality of standard circuit blocks, respectively, while defining as boundaries one or more sequential circuits on which the ideal clock signal condition is imposed, one or more tristate buffers on each of which the first ideal assertion period condition is imposed, and one or more other sequential circuits on each of which the second ideal assertion period condition is imposed, and then modifies each of the plurality of pieces of standard circuit block information so that each of the plurality of pieces of standard circuit block information satisfies the ideal clock signal condition and the first and second ideal assertion period conditions. Furthermore, the output function causes the computer to furnish the modified circuit information including a combination of the plurality of pieces of modified standard circuit block information. In addition, the timing design function can cause the computer to modify one piece of standard circuit block information associated with one circuit block located between a tristate buffer on which the first ideal assertion period condition is imposed and a sequential circuit located upstream from the tristate buffer for furnishing a control signal to the tristate buffer in response to the clock signal so that the piece of standard circuit block information satisfies a maximum delay time condition defining a maximum value of a time delay to be provided to the control signal with respect to the clock signal. The timing design means can also or alternatively cause the computer to modify one piece of standard circuit block information associated with one circuit block located between a sequential circuit on which the second ideal assertion period condition is imposed and another sequential circuit located upstream from the former sequential circuit for furnishing a control signal to the former sequential circuit in response to the clock signal so that the piece of standard circuit block information satisfies a maximum delay time condition defining a maximum value of a time delay to be provided to the control signal with respect to the clock signal.

In accordance with another aspect of the present invention, there is provided a computer-implemented logic synthesis method for generating information about a constitution of target circuitry on which a logic synthesis function is to be performed based on specifications of the target circuitry written in a hardware description language, the method comprising the steps of: generating standard circuit information about the target circuitry based on the specifications of the target circuitry, the standard circuit information logically matching the specifications; and modifying the standard circuit information so that the standard circuit information satisfies both an ideal clock signal condition defining an ideal clock signal to be applied to one or more sequential circuits included in the target circuitry, and at least either of a first ideal assertion period condition defining an ideal period of time during which each of one or more tristate buffers included in the target circuitry is asserted and a second ideal assertion period condition defining an ideal period of time during which each of one or more sequential circuits each for latching an output of a tristate buffer, which are included in the target circuitry is asserted.

The modifying step can include the steps of dividing the standard circuit information into a plurality of pieces of standard circuit block information that are associated with a plurality of standard circuit blocks, respectively, while defining as boundaries one or more sequential circuits on which the ideal clock signal condition is imposed, and at least either of one or more tristate buffers on each of which the first ideal assertion period condition is imposed and one or more other sequential circuits on each of which the second ideal assertion period condition is imposed; and modifying each of the plurality of pieces of standard circuit block information so that each of the plurality of pieces of standard circuit block information satisfies the ideal clock signal condition and at least either of the first and second ideal assertion period conditions. Furthermore, in the outputting step the modified circuit information including a combination of the plurality of pieces of modified standard circuit block information is furnished. In addition, the modifying step can include the step of modifying one piece of standard circuit block information associated with one circuit block located between a tristate buffer on which the first ideal assertion period condition is imposed or a sequential circuit on which the second ideal assertion period condition is imposed and another sequential circuit located upstream from either the tristate buffer or the former sequential circuit for furnishing a control signal to either the tristate buffer or the former sequential circuit in response to the clock signal so that the piece of standard circuit block information satisfies a maximum delay time condition defining a maximum value of a time delay to be provided to the control signal with respect to the clock signal.

In accordance with a preferred embodiment of the present invention, in the modifying step, the standard circuit information is modified so that the standard circuit information satisfies the ideal clock signal condition and the first and second ideal assertion period conditions. Preferably, the modifying step can include the steps of dividing the standard circuit information into a plurality of pieces of standard circuit block information that are associated with a plurality of standard circuit blocks, respectively, while defining as boundaries one or more sequential circuits on which the ideal clock signal condition is imposed, one or more tristate buffers on each of which the first ideal assertion period condition is imposed, and one or more other sequential circuits on each of which the second ideal assertion period condition is imposed; and modifying each of the plurality of pieces of standard circuit block information so that each of the plurality of pieces of standard circuit block information satisfies the ideal clock signal condition and the first and second ideal assertion period conditions. Furthermore, in the outputting step the modified circuit information including a combination of the plurality of pieces of modified standard circuit block information is furnished. The modifying step can include the step of modifying one piece of standard circuit block information associated with one circuit block located between a tristate buffer on which the first ideal assertion period condition is imposed and a sequential circuit located upstream from the tristate buffer for furnishing a control signal to the tristate buffer in response to the clock signal so that the piece of standard circuit block information satisfies a maximum delay time condition defining a maximum value of a time delay to be provided to the control signal with respect to the clock signal. The modifying step can also or alternatively include the step of modifying one piece of standard circuit block information associated with one circuit block located between a sequential circuit on which the second ideal assertion period condition is imposed and another sequential circuit located upstream from the former sequential circuit for furnishing a control signal to the former sequential circuit in response to the clock signal so that the piece of standard circuit block information satisfies a maximum delay time condition defining a maximum value of a time delay to be provided to the control signal with respect to the clock signal.

In accordance with another aspect of the present invention, there is provided a logic synthesis apparatus for generating information about a constitution of target circuitry based on specifications of the target circuitry written in a hardware description language, comprising: a storage unit for storing the specifications of the target circuitry, an ideal clock signal condition defining an ideal clock signal to be applied to one or more sequential circuits included in the target circuitry, and at least either of a first ideal assertion period condition defining an ideal period of time during which each of one or more tristate buffers included in the target circuitry is asserted and a second ideal assertion period condition defining an ideal period of time during which each of one or more other sequential circuits each for latching an output of a tristate buffer, which are included in the target circuitry is asserted; a standard design unit for generating standard circuit information about the target circuitry based on the specifications stored in the storage unit, the standard circuit information logically matching the specifications; a timing design unit for generating modified circuit information by modifying the standard circuit information so that the standard circuit information satisfies both the ideal clock signal condition and at least either of the first and second ideal assertion period conditions; and an output unit for outputting the modified circuit information.

Preferably, the timing design unit can divide the standard circuit information into a plurality of pieces of standard circuit block information that are associated with a plurality of standard circuit blocks, respectively, while defining as boundaries one or more sequential circuits on which the ideal clock signal condition is imposed, and at least either of one or more tristate buffers on each of which the first ideal assertion period condition is imposed and one or more other sequential circuits on each of which the second ideal assertion period condition is imposed, and then modifies each of the plurality of pieces of standard circuit block information so that each of the plurality of pieces of standard circuit block information satisfies both the ideal clock signal condition and at least either of the first and second ideal assertion period conditions. Furthermore, the output unit furnishes the modified circuit information including a combination of the plurality of pieces of modified standard circuit block information. In addition, the timing design unit can modify one piece of standard circuit block information associated with one circuit block located between a tristate buffer on which the first ideal assertion period condition is imposed or a sequential circuit on which the second ideal assertion period condition is imposed and another sequential circuit located upstream from the former sequential circuit for furnishing a control signal to the former sequential circuit in response to the clock signal so that the piece of standard circuit block information satisfies a maximum delay time condition defining a maximum value of a time delay to be provided to the control signal with respect to the clock signal.

In accordance with a preferred embodiment of the present invention, the timing design unit modifies the standard circuit information so that the standard circuit information satisfies the ideal clock signal condition and the first and second ideal assertion period conditions. The timing design unit can divide the standard circuit information into a plurality of pieces of standard circuit block information that are associated with a plurality of standard circuit blocks, respectively, while defining as boundaries one or more sequential circuits on which the ideal clock signal condition is imposed, one or more tristate buffers on each of which the first ideal assertion period condition is imposed, and one or more other sequential circuits on each of which the second ideal assertion period condition is imposed, and then modifies each of the plurality of pieces of standard circuit block information so that each of the plurality of pieces of standard circuit block information satisfies the ideal clock signal condition and the first and second ideal assertion period conditions. Furthermore, the output unit furnishes the modified circuit information including a combination of the plurality of pieces of modified standard circuit block information. In addition, the timing design unit can modify one piece of standard circuit block information associated with one circuit block located between a tristate buffer on which the first ideal assertion period condition is imposed and a sequential circuit located upstream from the tristate buffer for furnishing a control signal to the tristate buffer in response to the clock signal so that the piece of standard circuit information satisfies a maximum delay time condition defining a maximum value of a time delay to be provided to the control signal with respect to the clock signal, and one piece of standard circuit block information associated with one circuit block located between a sequential circuit on which the second ideal assertion period condition is imposed and another sequential circuit located upstream from the former sequential circuit for furnishing a control signal to the former sequential circuit in response to the clock signal so that the piece of standard circuit information satisfies a maximum delay time condition defining a maximum value of a time delay to be provided to the control signal with respect to the clock signal.

Further objects and advantages of the present invention will be apparent from the following description of the preferred embodiments of the invention as illustrated in the accompanying drawings.

DETAILED DESCRIPTION OF THE PREFERRED EMBODIMENTS

First Embodiment

Figure 1:
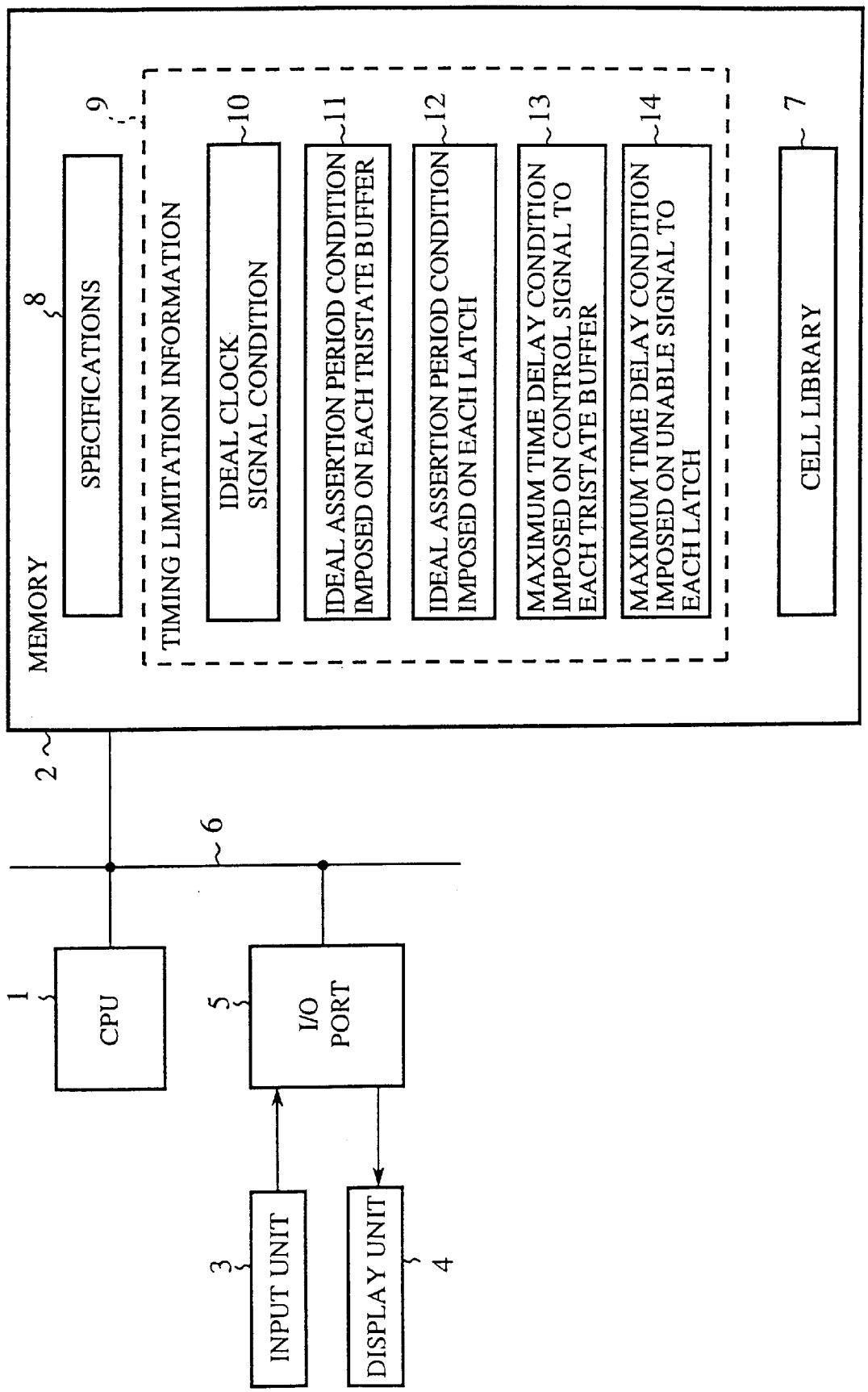
FIG. 1 is a block diagram showing the structure of a logic synthesis apparatus according to a first embodiment of the present invention.

Referring next to FIG. 1, there is illustrated a block diagram showing the structure of a logic synthesis apparatus according to a first embodiment of the present invention. In the figure, reference numeral 1 denotes a central processing unit for performing a logic synthesis function, 2 denotes a memory for storing information required for the logic synthesis function, temporary intermediate information, and so on, 3 denotes an input unit such as a keyboard or a pointing device, 4 denotes a display unit such as a CRT, 5 denotes an input/output (I/O) port for receiving data directly from the input unit 3 and for furnishing data directly to the display unit 4, and 6 denotes a system bus used for transmitting data among the central processing unit 1, memory 2, and I/O port 5.

Further, reference numeral 7 denotes a cell library having cell information about a number of cells including a plurality of gate-level standard cells and a plurality of block-level macro cells each constituted from a combination of standard cells, 8 denotes specification information about specifications of target circuitry on which the logic synthesis function is to be performed, which is described on the register transfer or RT level using a hardware description language (HDL), 9 denotes timing limitation information described in a logic synthesis script and used when the central processing unit performs the logic synthesis function, 10 denotes an ideal clock signal condition defining an ideal clock signal used for triggering one or more synchronization flip-flops, 11 denotes a first ideal assertion period condition defining an ideal assertion period of time during which a corresponding tristate buffer is asserted, 12 denotes a second ideal assertion period condition defining an ideal assertion period of time during which a corresponding data-latching half latch for latching an output of a tristate buffer is asserted, and 13 denotes a first maximum time delay condition defining a maximum value of a time delay to be provided to a control signal propagating from a synchronization flip-flop to a tristate buffer on which the first ideal assertion period condition 11 is imposed, with respect to the clock signal. The synchronization flip-flop generates the control signal in response to the clock signal. The time delay provided to the control signal is a time delay given by a circuit block located between the tristate buffer that can be asserted during the ideal assertion period defined by the first ideal assertion period condition 11 and the synchronization flip-flop upstream from the tristate buffer on a signal path (or propagation bus). In addition, 14 denotes a second maximum time delay condition defining a maximum value of a time delay to be provided to a control signal propagating from a synchronization flip-flop to a data-latching half latch on which the second ideal assertion period condition 12 is imposed, with respect to the clock signal. The synchronization flip-flop generates the control signal in response to the clock signal. The time delay provided to the control signal is a time delay given by a circuit block located between the data-latching half latch that can be asserted during the ideal assertion period defined by the second ideal assertion period condition 12 to the synchronization flip-flop upstream from the data-latching half latch on a signal path (or propagation bus).

The logic synthesis method according to the present can be implemented via software by the central processing unit 1. The software, i.e., logic synthesis program can be stored in a computer readable storage medium such as a CD-ROM.

Figure 2:
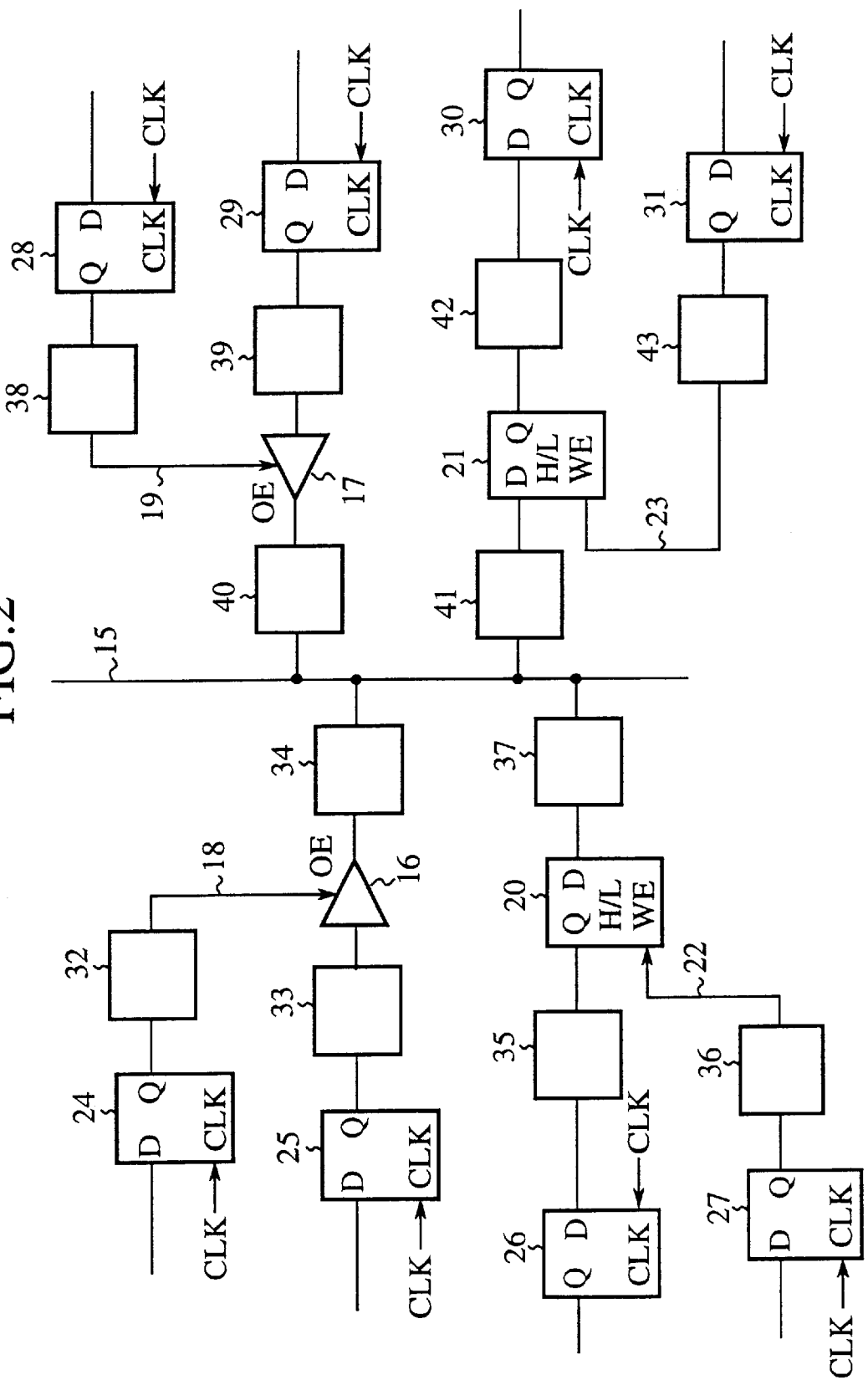
FIG. 2 is a block diagram showing the structure of an example of target circuitry including a tristate bus, on which a logic synthesis function is to be performed by the logic synthesis apparatus of the first embodiment of the present invention.

Referring next to FIG. 2, there is illustrated a block diagram showing the structure of a example of target circuitry including a tristate bus, on which a logic synthesis function is performed by the logic synthesis apparatus of the first embodiment of the present invention. Only one tristate bus is shown in FIG. 2. In the figure, reference numeral 15 denotes a tristate bus, 16 and 17 denote tristate buffers each having an output control terminal, 18 and 19 denote output enable signals that are applied to the output control terminals of the tristate buffers 16 and 17, respectively, 20 and 21 denote data-latching half latches each having a latch control terminal, 22 and 23 denote write enable signals that are applied to the latch control terminals of the data-latching half latches 20 and 21, respectively, 24 to 31 denote synchronization flip-flops to which a clock signal is applied, 32 denotes a combinational circuit located between the synchronization flip-flop 24 and the output control terminal of the tristate buffer 16, 33 denotes a combinational circuit located between the synchronization flip-flop 25 and the input terminal of the tristate buffer 16, 34 denotes a combinational circuit located between the output terminal of the tristate buffer 16 and the tristate bus 15, 35 denotes a combinational circuit located between the synchronization flip-flop 26 and the Q terminal of the data-latching half latch 20, 36 denotes a combinational circuit located between the synchronization flip-flop 27 and the latch control terminal of the data-latching half latch 20, 37 denotes a combination circuit located between the output terminal of the data-latching half latch 20 and the tristate bus 15, 38 denotes a combinational circuit located between the synchronization flip-flop 28 and the output control terminal of the tristate buffer 17, 39 denotes a combinational circuit located between the synchronization flip-flop 29 and the input terminal of the tristate buffer 17, 40 denotes a combination circuit located between the output terminal of the tristate buffer 17 and the tristate bus 15, 42 denotes a combinational circuit located between the synchronization flip-flop 30 and the Q terminal of the data-latching half latch 21, 43 denotes a combinational circuit located between the synchronization flip-flop 31 and the latch control terminal of the data-latching half latch 21, and 41 denotes a combinational circuit located between the output terminal of the data-latching half latch 21 and the tristate bus 15.

Next, a description will be made as to the logic synthesis function performed by the central processing unit, taking the circuitry as shown in FIG. 2 including such the tristate bus 15 as an example. First, the central processing unit 1 receives definition information about a definition of the tristate bus 15, a definition of each of the two tristate buffers 16 and 17, a definition of each of the two data-latching half latches 20 and 21, a definition of each of the plurality of synchronization flip-flops 24 to 31, and a definition of the plurality of combinational circuits 32 to 43. The central processing unit 1 then stores the definition information in the memory 2.

Figure 3:
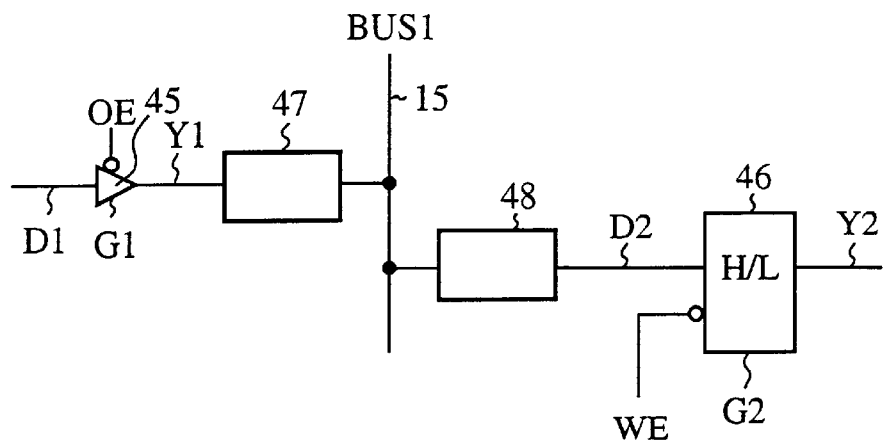
FIG. 3 is a block diagram showing the structure of a main part of the example shown in FIG. 2 of the target circuitry, including the tristate bus.

Referring next to FIG. 3, there is illustrated a block diagram showing the structure of a main part of the example shown in FIG. 2 of the target circuitry, including the tristate bus 15. In the figure, reference numeral 45 denotes a tristate buffer that can be either of the two tristate buffers 16 and 17 as shown in FIG. 2, 46 denotes a data-latching half latch that can be either of the two data-latching half latches 20 and 21 as shown in FIG. 2, 47 denotes a combinational circuit that can be either of the combinational circuits 34 and 40 as shown in FIG. 2, and 48 denotes a combinational circuit that can be either of the combinational circuits 37 and 41 as shown in FIG. 2. When signals BUS1, OE, D1, WE, D2, and Y2 are defined as shown in FIG. 3, each cell can be described by a statement written in the hardware description language (HDL), as in the following definition expressions:

definition expression 1: use_tristate "BUS1";
   definition expression 2: Y1=OE?D1:1'bz;
   definition expression 3: always@(WE or D2) if(WE) Y2←D2;

The definition expression 1 is an example of a logic synthesis script that declares the tristate bus 15. The definition expression 2 is an example of an HDL statement that defines the tristate buffer 45 connected to the tristate bus 15 by way of the combinational circuit 47. The definition expression 3 is an example of an HDL statement that defines a level-sensitive latch such as the data-latching half latch 46 for latching data on the tristate bus 15. The logic synthesis script "use_tristate "signal's name"" declares that the signal is transmitted via the tristate bus. The definition expression 2 has a form-such as "output data=output enable signal?first input data:second input data" indicating that the first input data is furnished as the output data if the output enable signal is state 1, i.e., active, and the second input data is furnished as the output data if the output enable signal is state 0, i.e., inactive. In the definition expression 2 shown above, 1'bz means a 1-bit binary value showing a high-impedance input. The definition expression 3 has a form such as "always@ (write enable signal or input data) if (write enable signal) output data←input data" indicating that every time either the write enable signal or the input data is changed, the input data is furnished as the output data only if the write enable signal is active.

The central processing unit 1 then receives the ideal clock signal condition 10 for the plurality of synchronization flip-flops 24 to 31, the first ideal assertion period condition 11 for each output enable signal applied to each tristate buffer, the second ideal assertion period condition 12 for each write enable signal applied to each data-latching half latch, the first maximum time delay condition 13 for defining the maximum time delay to be provided to the output enable signal applied to each of the tristate buffers 16 and 17 with respect to the ideal clock signal condition 10, and the second maximum delay time condition 14 for defining the maximum time delay to be provided to the write enable signal applied to each of the data-latching half latches 20 and 21 with respect to the ideal clock signal condition 10. The central processing unit then stores those conditions 10 to 14 in the memory 2.

The following definition expression 4 is an example of a logic synthesis script that describes the ideal clock signal condition 10. The following definition expression 5 is an example of a logic synthesis script that describes the first ideal assertion period condition 11 for defining an ideal assertion period of time during which the output enable signal applied to the tristate buffer 45 is asserted LOW. The following definition expression 6 is an example of a logic synthesis script that describes the second ideal assertion period condition 12 for defining an ideal assertion period of time during which the write enable signal applied to the data-latching half latch 46 is asserted LOW.

definition expression 4: create_clock -name "CLK" -period 100 -waveform {"0" "50"}
   definition expression 5: create_output_enable -negedge "CLK" -period 200 -name "OE" -waveform {"60" "260"} -low_active
   definition expression 6: create_write_enable -posedge "CLK" -period 200 -name "WE" -waveform {"110" "210"} -low_active -level_sense -sync "OE"

In the definition expression 4, "create_clock" is a reserved word for defining the clock signal, the first option parameter "-name "CLK"" shows the name of the clock signal, in the above example "CLK", the second option parameter "-period 100" shows the pulse repetition period of the clock signal, in the above example 100, and the third option parameter "-waveform {"0" "50"}" shows the period during which the clock signal is at a high level within one pulse repetition period, in the above example the period from 0 to 50. In the definition expression 5, "create_output_enable" is a reserved word for defining the output enable signal applied to the output control terminal of a tristate buffer, the first option parameter "-negedge "CLK"" shows that the output enable signal is triggered upon falling edges of a reference signal, in this example the clock signal "CLK", the second option parameter "-period 200" shows one bus cycle in which the output enable signal is asserted, the third option parameter "-name "OE"" shows the name of the output enable signal, the fourth option parameter "-waveform {"60" "260"}" shows the period during which the output enable signal is asserted, in this case the period from 60 to 260, and the fifth option parameter "-low_active" shows that the output enable signal is active low. In the definition expression 6, "create_write_enable" is a reserved word for defining the write enable signal applied to the latch control terminal of a data-latching half latch that can receive data from the tristate buffer whose control signal is defined by the above definition expression 6, the first option parameter "-posedge "CLK"" shows that the write enable signal is triggered upon rising edges of a reference signal, in this case the clock signal "CLK", the second option parameter "-period 200" shows one bus cycle in which the write enable signal is asserted, the third option parameter "-name "WE"" shows the name of the write enable signal, the fourth option parameter "-waveform {"110" "210"}" shows the period during which the write enable signal is asserted, in this case the period from 110 to 210, the fifth option parameter "-low_active" shows that the write enable signal is active low, the sixth option parameter "-level_sense" shows that the write enable signal is level sensitive, and the seventh option parameter "-sync "OE"" shows that the write enable signal is used in synchronization with the output enable signal OE.

Figure 4:
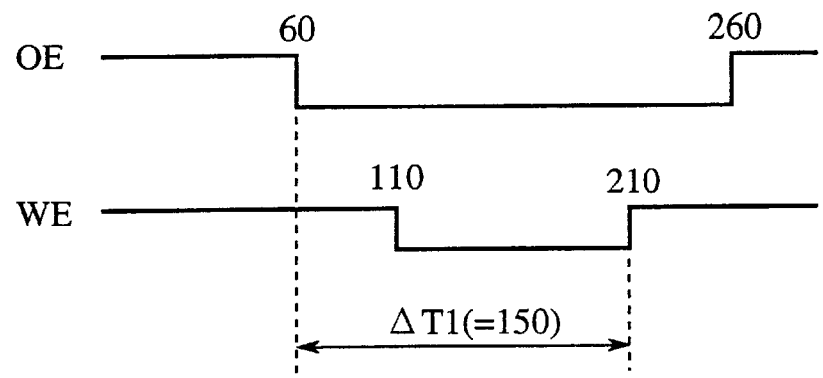
FIG. 4 is a timing chart showing both a first ideal assertion period defined by definition expression 5, and a second ideal assertion period defined by definition expression 6.
Figure 5:
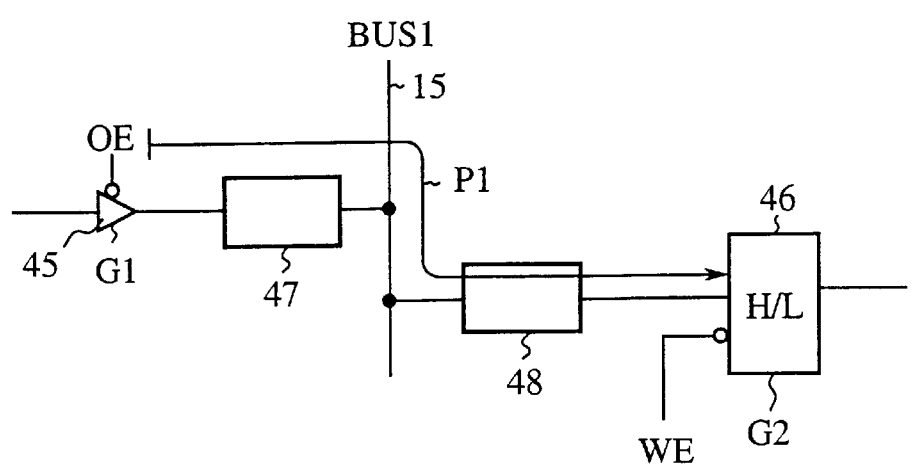
FIG. 5 is a diagram showing part of the target circuitry that is defined by the definition expressions 5 and 6.

Referring next to FIG. 4, there is illustrated a timing chart showing both the ideal assertion period of the output enable signal OE defined by the definition expression 5, and the ideal assertion period of the write enable signal WE defined by the definition expression 6. As shown in FIG. 4, the output enable signal OE is asserted during the ideal assertion period from 60 to 260, and the write enable signal WE is asserted during the ideal assertion period from 110 to 210. $\Delta T_1$ shows a period of time between the instant when the output enable signal OE is asserted and the instant when the assertion of the write enable signal WE is complete. The output of the tristate buffer 45 has to propagate over a signal path indicated by P1 in FIG. 5 within the time period $\Delta T_1$. The delay time that can be caused by the combinational circuits 47 and 48 between the tristate buffer 45 and the data-latching half latch 46 is thus limited by both the ideal assertion period during which the output enable signal OE applied to the tristate buffer 45 is asserted, and the ideal assertion period during which the write enable signal WE applied to the data-latching half latch 46 is asserted.

The logic synthesis script that describes the maximum time delay condition 13 for defining a maximum value of the time delay in the input timing of the output enable signal OE to the tristate buffer 45 with respect to the clock signal CLK defined by the ideal clock signal condition 10 is given by the following definition expression 7:

definition expression 7: set_enable_delay 5 -negedge CLK "OE"

where "set_enable_delay" is a reserved word for defining a limitation imposed on the timing of an enable signal, "5" behind the reserved word shows the upper limit of the time delay, i.e., the allowable maximum time delay, the option parameter "-negedge CLK" shows that the enable signal is made to be synchronized with falling edges of the clock signal CLK, and ""OE"" behind the option parameter shows the name of the enable signal, in this case the output enable signal's name.

Figure 6:
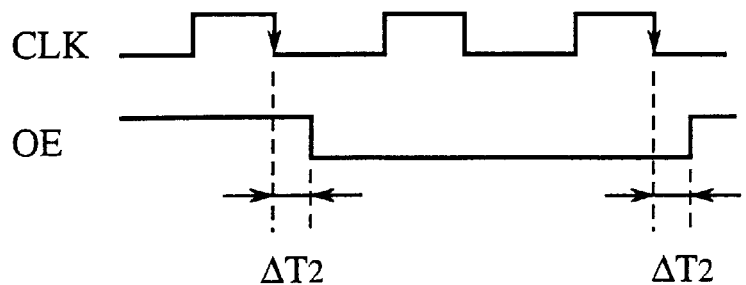
FIG. 6 is a timing chart showing a maximum value of a time delay defined by definition expression 7.
Figure 7:
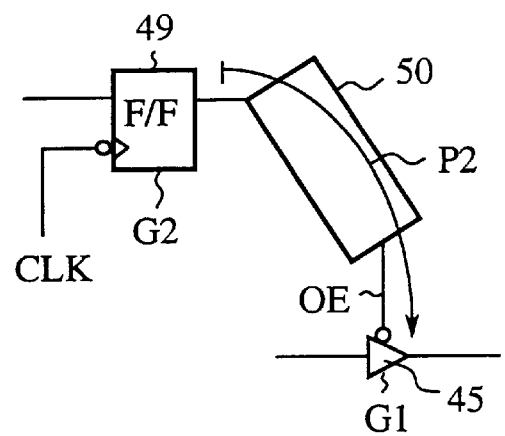
FIG. 7 is a diagram showing part of the target circuitry that is defined by the definition expression 7.

Referring next to FIG. 6, there is illustrated a timing chart showing the maximum value of the time delay defined by the above-mentioned definition expression 7. FIG. 7 shows a block diagram showing a circuit that can provide a time delay whose maximum value is defined by the definition expression 7. In the figure, 49 denotes a synchronization flip-flop to which the clock signal is applied, and 50 denotes a combinational circuit. As shown in FIG. 6, the output enable signal OE applied to the tristate buffer 45 makes a HIGH to LOW transition at the expiration of $\Delta T_2$ after the synchronization flip-flop 49 has received a falling edge of the ideal clock signal CLK. The upper limit of the time delay $\Delta T_2$ is limited by the definition expression 7.

The logic synthesis script that describes the maximum time delay condition 14 for defining a maximum value of the time delay in the input timing of the write enable signal WE to the data-latching half latch 46 with respect to the clock signal CLK defined by the ideal clock signal condition 10 is given by the following definition expression 8:

definition expression 8: set_enable_delay 8 -posedge CLK "WE"

where "8" behind the reserved word "set_enable_delay" shows the upper limit of the time delay, i.e., the allowable maximum time delay, the option parameter "-posedge CLK" shows that the enable signal is made to be synchronized with rising edges of the clock signal CLK, and ""WE"" behind the option parameter shows the name of the enable signal, in this case the write enable signal's name.

Figure 8:
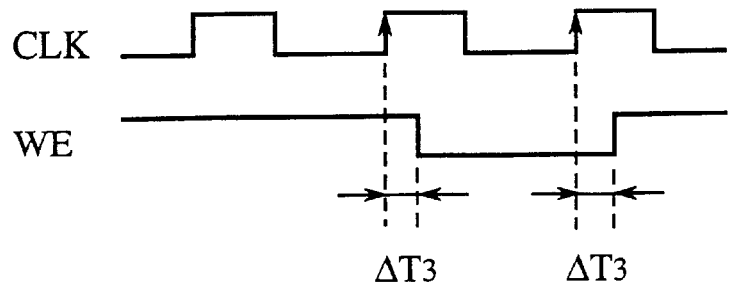
FIG. 8 is a timing chart showing a maximum value of a time delay defined by definition expression 8.
Figure 9:
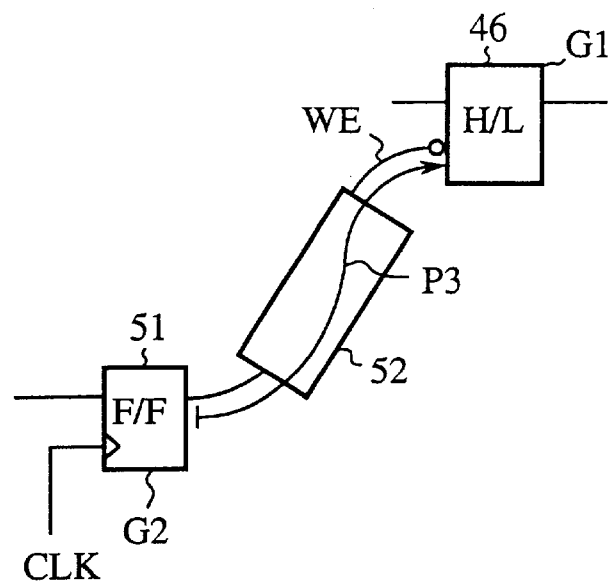
FIG. 9 is a diagram showing part of the target circuitry that is defined by the definition expression 8.

Referring next to FIG. 8, there is illustrated a timing chart showing the maximum value of the time delay defined by the above-mentioned definition expression 8. FIG. 9 shows a block diagram showing a circuit that can provide a time delay whose maximum value is defined by the definition expression 8. In the figure, 51 denotes a synchronization flip-flop to which the clock signal is applied, and 52 denotes a combinational circuit. As shown in FIG. 8, the write enable signal WE applied to the data-latching half latch 46 makes a HIGH to LOW transition at the expiration of $\Delta T_3$ after the synchronization flip-flop 51 has received a rising edge of the ideal clock signal CLK. The upper limit of the time delay $\Delta T_3$ is limited by the definition expression 8.

After those conditions 8 to 14 have been set, the central processing unit 1 performs a logic synthesis function based on those pieces of information. The central processing unit 1 carries out a logical analysis of the specification information 8 read out of the memory 2, first, and then performs a function of mapping a number of circuit functions to a number of gate-level standard cells based on the analysis result and a function of generating information about connections between standard cells, i.e., a net list. The standard circuit information including the net list, mapping information, and types of standard cells is thus generated. In this specification, a standard cell is referred to as a cell of one certain type, which can be selected from among a number of cells stored in the cell library 7. A plurality of standard cells are selected from the cell library 7. In general, the cell library 7 can store a number of pieces of cell information about a number of cells of various types. The various types of cells can be categorized into a plurality of groups in terms of electric characteristics such as fan out and gate time delay. For example, a single-size two-input AND cell, a double-size two-input AND cell, and a quad-size two-input AND cell are categorized into the same group, because all the three types of cells have the same two-input logical AND function. Then one of the three types of cells can be selected as the standard cell having the two-input logical AND function. Generally, from a plurality of cells with the same function, the one with the smallest power consumption and a smaller size can be selected as the standard cell that acts on behalf of the group consists of the plurality of cells with the same function.

The central processing unit 1 then reads the variety of pieces of timing limitation information 9 from the memory 2, and modifies the whole or part of the standard circuit information so that it satisfies or complies with those pieces of timing limitation information 9. The central processing unit 1 generates timing circuit information including the modified standard circuit information, i.e., the final net list having connections that can be laid out on chip, mapping information, and so on, and then furnishes the timing circuit information to the memory 2.

To be more specific, the central processing unit 1 can extract all elements on each of which a timing limitation condition is imposed from the target logic circuitry on which the logic synthesis function is to be performed including the tristate bus 15 as shown in FIG. 2, i.e., the synchronization flip-flops 24 to 31, the data-latching half latches 20 and 21, and the tristate buffers 16 and 17. The central processing unit 1 then divides the standard circuit information about the target logic circuitry into a plurality of pieces of standard circuit block information that are associated with a plurality of standard circuit blocks, respectively, while dividing as boundaries the synchronization flip-flops 24 to 31, the data-latching half latches 20 and 21, and the tristate buffers 16 and 17. In the case of FIG. 2, the combinational circuits 32 to 43 are standard circuit blocks. The central processing unit 1 modifies each piece of standard circuit block information about each of the plurality of standard circuit blocks, such as the mapping information and types of cells, based on the timing limitation information 9 about elements located at the back and front of each of the plurality of standard circuit blocks so that each piece of standard circuit block information satisfies the timing limitation condition 9.

For example, in the case of modifying the standard circuit information about the target logic circuitry as shown in FIG. 2 based on the timing limitation information 9, the standard circuit information about each of the combinational circuits 33 and 39 is modified so that the time delay caused by each of the combinational circuits 33 and 39 does not exceed a maximum time delay determined by both the ideal clock signal condition 10 imposed on the plurality of synchronization flip-flops 24 to 31 and the ideal assertion period condition 11 imposed on the output enable signal applied to each of the tristate buffers 16 and 17. The standard circuit information about each of the combinational circuits 35 and 42 is modified so that the time delay caused by each of the combinational circuits 35 and 42 does not exceed a maximum time delay determined by both the ideal clock signal condition 10 imposed on the plurality of synchronization flip-flops 24 to 31 and the ideal assertion period condition 12 imposed on the write enable signal applied to each of the data-latching half latches 20 and 21. The standard circuit information about each of the four sets of combinational circuits 34 and 41, 34 and 37, 40 and 41, and 40 and 37 is modified so that the time delay caused by each of the four sets of combinational circuits does not exceed a maximum time delay determined by both the first ideal assertion period condition 11 imposed on the output enable signal applied to each of the tristate buffers 16 and 17, and the second ideal assertion period condition 12 imposed on the write enable signal applied to each of the data-latching half latches 20 and 21. In addition, the standard circuit information about each of the combinational circuits 32 and 38 is modified so that the time delay caused by each of the combinational circuits 32 and 38 does not exceed a maximum time delay determined by the maximum time delay condition 13 defining a maximum value of the time delay to be provided to the output enable signal applied to each of the two tristate buffers 16 and 17 with respect to the ideal clock signal condition 10. The standard circuit information about each of the combinational circuits 36 and 43 is modified so that the time delay caused by each of the combinational circuits 36 and 43 does not exceed a maximum time delay determined by the maximum time delay condition 14 defining a maximum value of the time delay to be provided to the write enable signal applied to each of the two data-latching half latches 20 and 21 with respect to the ideal clock signal condition 10.

Figure 10:
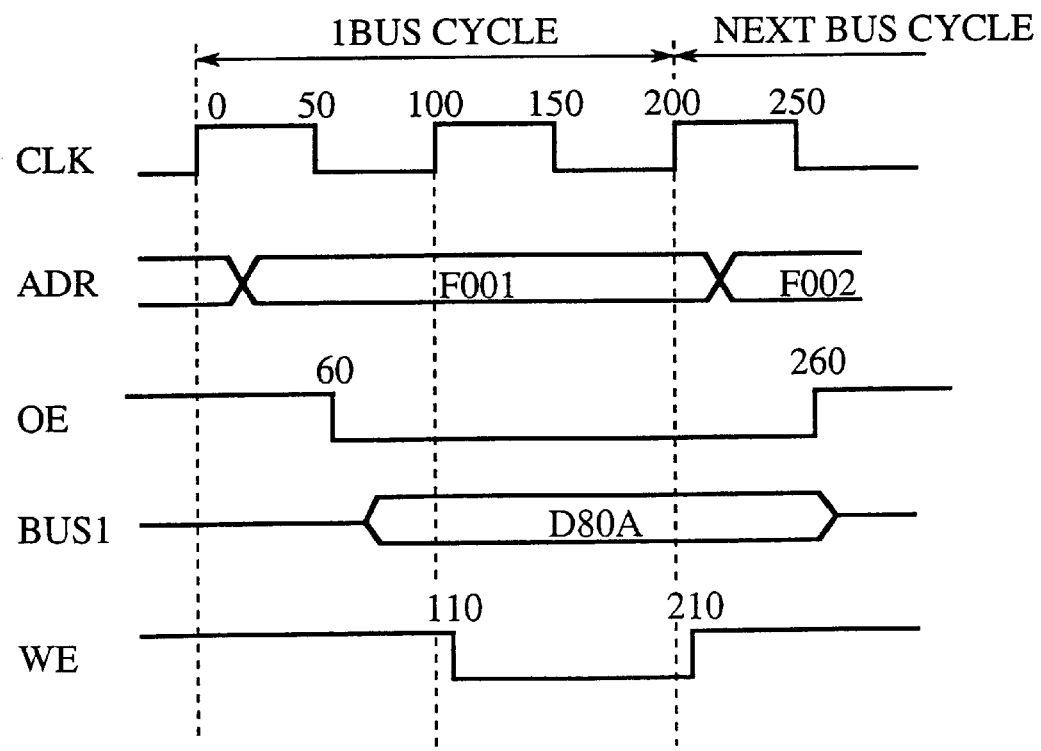
FIG. 10 is a timing chart showing an example of the timing of signals associated with a tristate bus which can be constituted by the logic synthesis apparatus according to the first embodiment of the present invention.

Referring next to FIG. 10, there is illustrated a timing chart showing an example of the timing of signals associated with the tristate bus 15 which can be constituted by the logic synthesis apparatus according to the first embodiment of the present invention. In the figure, reference character ADR denotes an address specifying the destination of an output of either of the tristate buffers 16 and 17, and BUS1 denotes a data transmitted from either of the tristate buffers 16 and 17, by way of the tristate bus 15, to a corresponding one of the data-latching half latches 20 and 21. When the timing of the output enable signal OE and the write enable signal WE is set as shown in FIG. 10, either of the tristate buffers 16 and 17 can transfer a data to either of the data-latching half latches 20 and 21 by way of the tristate bus 15 once at every bus cycle, which translates into once at every two clock cycles.

As previously mentioned, the logic synthesis method according to the first embodiment of the present invention, which can be implemented via software by the central processing unit 1, can modify the whole or part of the standard circuit information about target circuitry so that it satisfies the ideal clock signal condition 10, which is imposed on sequential circuits such as the synchronization flip-flops 24 to 31 as shown in FIG. 2, the first ideal assertion period condition 11, which is imposed on each of tristate buffers, and the second ideal assertion period condition 12, which is imposed on each of other sequential circuits such as the data-latching half latches 20 and 21 as shown in FIG. 2. The ideal clock signal condition 10, the first ideal assertion period condition 11, and the second ideal assertion period condition 12 are stored in the memory 2. When modifying the standard circuit information, the central processing unit 1 read those conditions 10 to 12 from the memory 2. Accordingly, by providing different ideal assertion periods for the plurality of tristate buffers, collisions between outputs of the plurality of tristate buffers on the tristate bus 15 can be prevented. Each of the plurality of data-latching half latches can latch data on the tristate bus 15 that remains in a stable state in which collisions between data from the plurality of tristate buffers on the tristate bus 15 can be prevented. The timing of the signals associated with the tristate bus 15 connected via combinational circuits to the outputs of the plurality of tristate buffers can thus be optimized. The first embodiment of the present invention can offer the advantage of being able to constitute the target circuitry including an optimum tristate bus even though the timing of signals associated with the tristate bus is tight.

In addition, in accordance with the first embodiment of the present invention, the central processing unit 1 can divide the standard circuit information into a plurality of pieces of standard circuit block information that are associated with a plurality of standard circuit blocks, respectively, while defining as boundaries the plurality of flip-flops 24 to 31 on which the ideal clock signal condition is imposed, and the two tristate buffers 16 and 17 on each of which the first ideal assertion period condition is imposed and the two data-latching half latches 20 and 21 on each of which the second ideal assertion period condition is imposed, and then modifies each of the plurality of pieces of standard circuit block information so that each of the plurality of pieces of standard circuit block information satisfies the ideal clock signal condition and the first and second ideal assertion period conditions, and then furnish modified circuit information including a combination of the plurality of pieces of modified standard circuit block information. Accordingly, the output timing of each of the plurality of tristate buffers 16 and 17 can be set so that it furnishes data onto the tristate bus 15 during a different predetermined period of time. The latching timing of a corresponding half latch can also be set within the predetermined time period. Thus each of the plurality of data-latching half latches can latch data on the tristate bus 15 that remains in a stable state in which collisions between data from the plurality of tristate buffers on the tristate bus 15 can be prevented.

Furthermore, in accordance with the first embodiment of the present invention, the central processing unit 1 can modify one piece of standard circuit block information associated with one circuit block, such as the combinational circuit 32 or 38, located between the tristate buffer 16 or 17 on which the first ideal assertion period condition is imposed and the synchronization flip-flop 24 or 28 located upstream from the tristate buffer for furnishing the output enable signal to the tristate buffer in response to the clock signal so that the piece of standard circuit block information satisfies a predetermined maximum delay time condition defining a maximum value of the time delay to be provided to the output enable signal with respect to the clock signal.

Therefore, the first embodiment offers another advantage of being able to set the output timing of the output enable signal applied to each of the plurality of tristate buffers, thus preventing collisions between outputs of the plurality of tristate buffers on the tristate bus 15, even though the circuit block, such as the combinational circuit 32 or 38, has a large size.

In addition, in accordance with the first embodiment of the present invention, the central processing unit 1 can modify one piece of standard circuit block information associated with one circuit block, such as the combinational circuit 36 or 43, located between the data-latching half latch 20 or 21 on which the second ideal assertion period condition is imposed and the synchronization flip-flop 27 or 31 located upstream from the data-latching half latch for furnishing the write enable signal to the data-latching half latch in response to the clock signal so that the piece of standard circuit block information satisfies a predetermined maximum delay time condition defining a maximum value of the time delay to be provided to the write enable signal with respect to the clock signal. Therefore, the first embodiment offers another advantage of being able to set the level-latching timing of the write enable signal applied to each of the plurality of data-latching half latches, thus enabling each of the plurality of data-latching half latches to latch data on the tristate bus 15 that remains in a stable state in which collisions between data from the plurality of tristate buffers on the tristate bus 15 can be prevented.

When the combinational circuit 32, 38, 36, or 43, which is located at the front of the control terminal of the tristate buffer 16 or 17, or data-latching half latch 20 or 21 is so small in size that the time delay caused by the combinational circuit 32, 38, 36, or 43 may be ignored, the central processing unit 1 does not necessarily require setting a maximum value of the time delay to be provided to a control signal applied to the control terminal.

Second Embodiment

Figure 11:
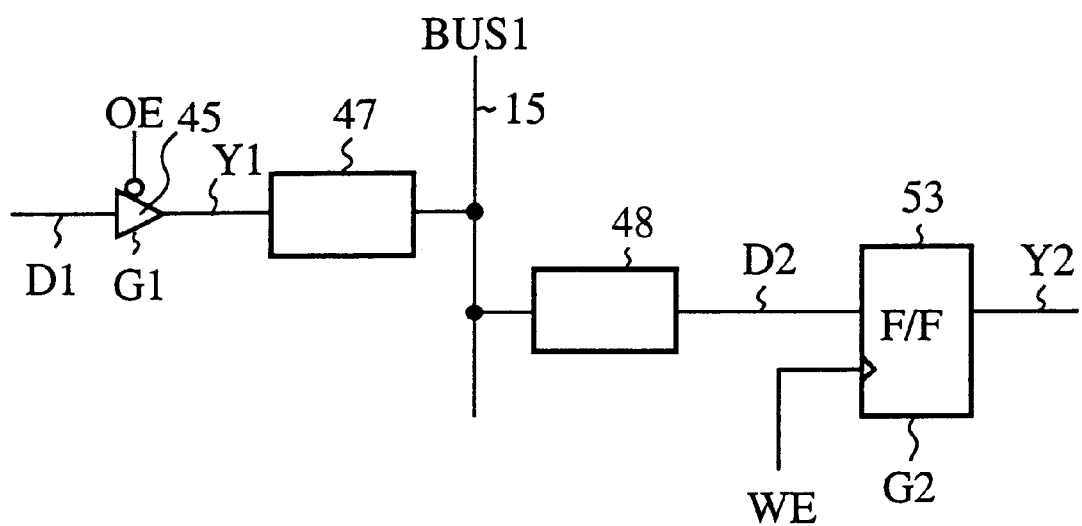
FIG. 11 is a block diagram showing the structure of a main part including a tristate bus of an example of target logic circuitry on which a logic synthesis function is to be performed by a logic synthesis apparatus according to a second embodiment of the present invention.
Figure 12:
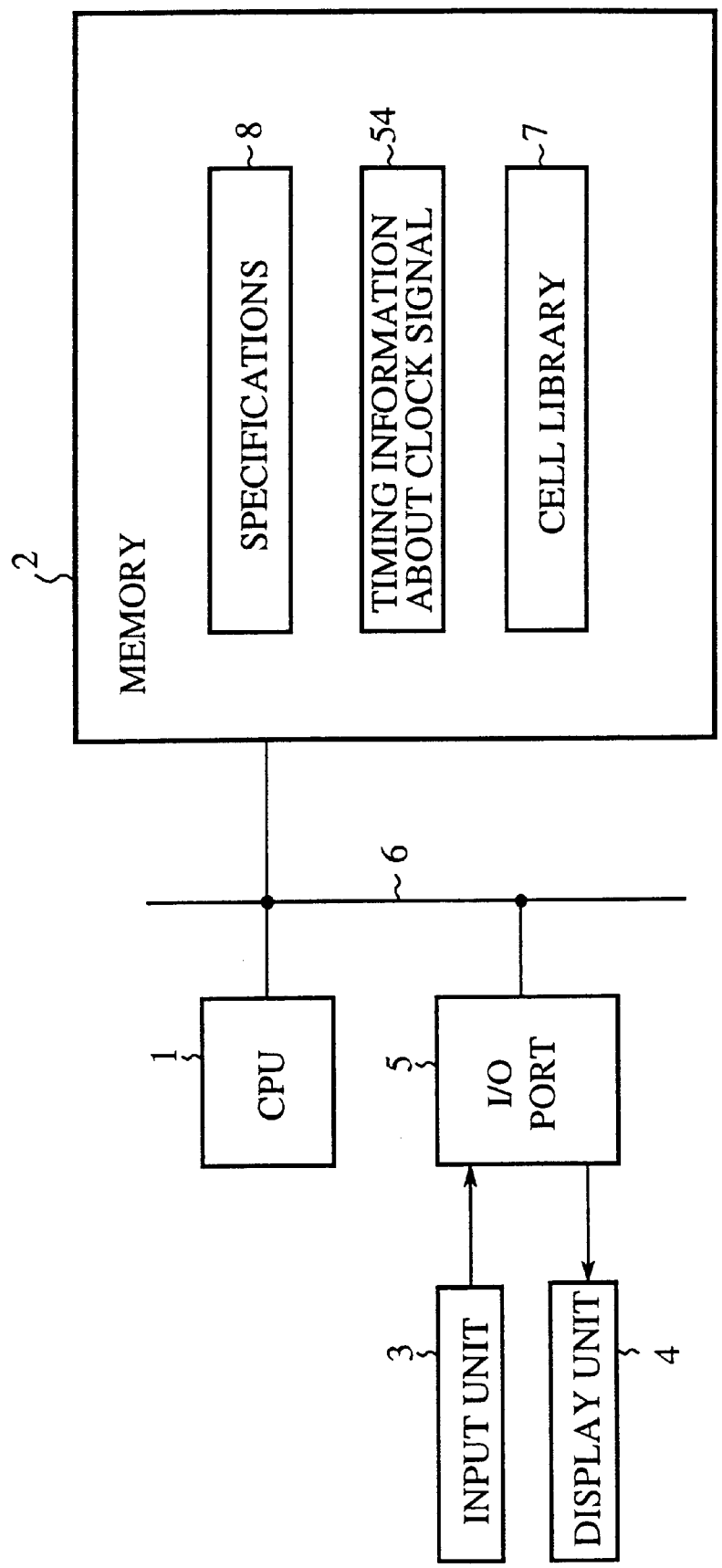
FIG. 12 is a block diagram showing the structure of a prior art logic synthesis apparatus.

Referring next to FIG. 11, there is illustrated a block diagram showing the structure of a main part including a tristate bus 15 of an example of target logic circuitry on which a logic synthesis function of a logic synthesis method according to a second embodiment of the present invention is to be performed. In the figure, reference numeral 53 denotes a data-latching flip-flop that is an edge trigger (or edge-sensitive) flip-flop. The other structure of the main part is the same as that of the main part as shown in FIG. 3 and the other components are designated by the same reference numerals as shown in FIG. 3, and therefore, the description of the same components will be omitted hereinafter.

The following definition expression 9 is an example of an HDL statement that defines an edge trigger flip-flop such as the data-latching flip-flop 53 for latching data on the tristate bus 15. The following definition expression 10 is an example of a logic synthesis script that describes a second ideal assertion period condition 12, as shown in FIG. 1, for defining an ideal assertion period of time during which a write enable signal applied to the data-latching half latch 53 is asserted LOW.

definition expression 9: always@(negedge WE) Y2←D2;
definition expression 10: create_write_enable -posedge "CLK" -period 350 -name "WE" -waveform {"110" "360"} -low_active -edge _trigger_sync "OE"

The definition expression 9 has a form such as "always@ (negedge WE) output data←input data" indicating that the input data is furnished as the output data on falling edges of the write enable signal WE. The definition expression 10 has the same form as the definition expression 6 as mentioned in First Embodiment, except that the sixth option parameter "-edge_trigger" shows that the write enable signal is an edge trigger.

Even when the data-latching flip-flop 53 is constructed of an edge trigger flip-flop, the logic synthesis apparatus according to the second embodiment of the present invention can set the trigger timing of the data-latching flip-flop 53 using the statements described in the definition expressions 9 and 10 as a piece of timing limitation information 9, and modify the standard circuit information about target logic circuitry based on the timing limitation information 9 so as to perform a logic synthesis function on the target logic circuitry.

Many widely different embodiments of the present invention may be constructed without departing from the spirit and scope of the present invention. It should be understood that the present invention is not limited to the specific embodiments described in the specification, except as defined in the appended claims.

What is claimed is:

1. A computer readable storage medium having logic synthesis code means embodied therein, said logic synthesis code means comprising:

standard design means for causing a computer to generate standard circuit information about target circuitry on which a logic synthesis function is to be performed, based on specifications of the target circuitry written in a hardware description language, said standard circuit information logically matching said specifications;

timing design means for causing the computer to generate modified circuit information by modifying said standard circuit information so that said standard circuit information satisfies both an ideal clock signal condition defining an ideal clock signal to be applied to one or more sequential circuits included in said target circuitry, and at least either of a first ideal assertion period condition defining an ideal period of time during which each of one or more tristate buffers included in said target circuitry is asserted and a second ideal assertion period condition defining an ideal period of time during which each of one or more other sequential circuits for latching an output of a tristate buffer, which are included in said target circuitry is asserted; and output means for outputting said modified circuit information from said timing design means.

2. The computer readable storage medium according to claim 1, wherein said timing design means divides said standard circuit information into a plurality of pieces of standard circuit block information that are associated with a plurality of standard circuit blocks, respectively, while defining as boundaries said one or more sequential circuits on which said ideal clock signal condition is imposed, and at least either of said one or more tristate buffers on each of which said first ideal assertion period condition is imposed and said one or more other sequential circuits on each of which said second ideal assertion period condition is imposed, and then modifies each of said plurality of pieces of standard circuit block information so that each of said plurality of pieces of standard circuit block information satisfies said ideal clock signal condition and at least either of said first and second ideal assertion period conditions, and wherein said output means causes the computer to furnish said modified circuit information including a combination of said plurality of pieces of modified standard circuit block information.

3. The computer readable storage medium according to claim 2, wherein said timing design means causes the computer to modify said one piece of standard circuit block information associated with one circuit block located between either a tristate buffer on which said first ideal assertion period condition is imposed or a sequential circuit on which said second ideal assertion period condition is imposed and another sequential circuit located upstream from either said tristate buffer or said former sequential circuit for furnishing a control signal to either said tristate buffer or said former sequential circuit in response to said clock signal so that said piece of standard circuit block information satisfies a maximum delay time condition defining a maximum value of a time delay to be provided to said control signal with respect to said clock signal.

4. The computer readable storage medium according to claim 1, wherein said timing design means causes the computer to generate said modified circuit information by modifying said standard circuit information so that said standard circuit information satisfies said ideal clock signal condition and said first and second ideal assertion period conditions.

5. The computer readable storage medium according to claim 4, wherein said timing design means divides said standard circuit information into a plurality of pieces of standard circuit block information that are associated with a plurality of standard circuit blocks, respectively, while defining as boundaries said one or more sequential circuits on which said ideal clock signal condition is imposed, said one or more tristate buffers on each of which said first ideal assertion period condition is imposed, and said one or more other sequential circuits on each of which said second ideal assertion period condition is imposed, and then modifies each of said plurality of pieces of standard circuit block information so that each of said plurality of pieces of standard circuit block information satisfies said ideal clock signal condition and said first and second ideal assertion period conditions, and wherein said output means causes the computer to furnish said modified circuit information including a combination of said plurality of pieces of modified standard circuit block information.

6. The computer readable storage medium according to claim 5, wherein said timing design means causes the computer to modify said one piece of standard circuit block information associated with one circuit block located between a tristate buffer on which said first ideal assertion period condition is imposed and a sequential circuit located upstream from said tristate buffer for furnishing a control signal to said tristate buffer in response to said clock signal so that said piece of standard circuit block information satisfies a maximum delay time condition defining a maximum value of a time delay to be provided to said control signal with respect to said clock signal.

7. The computer readable storage medium according to claim 5, wherein said timing design means causes the computer to modify said one piece of standard circuit block information associated with one circuit block located between a sequential circuit on which said second ideal assertion period condition is imposed and another sequential circuit located upstream from said former sequential circuit for furnishing a control signal to said former sequential circuit in response to said clock signal so that said piece of standard circuit block information satisfies a maximum delay time condition defining a maximum value of a time delay to be provided to said control signal with respect to said clock signal.

8. A computer-implemented logic synthesis method for generating information about a constitution of target circuitry on which a logic synthesis function is to be performed based on specifications of the target circuitry written in a hardware description language, said method comprising the steps of:

generating standard circuit information about the target circuitry based on the specifications of said target circuitry, said standard circuit information logically matching said specifications; and modifying said standard circuit information so that said standard circuit information satisfies both an ideal clock signal condition defining an ideal clock signal to be applied to one or more sequential circuits included in said target circuitry, and at least either of a first ideal assertion period condition defining an ideal period of time during which each of one or more tristate buffers included in said target circuitry is asserted and a second ideal assertion period condition defining an ideal period of time during which each of one or more sequential circuits each for latching an output of a tristate buffer, which are included in said target circuitry is asserted.

9. The computer-implemented logic synthesis method according to claim 8, wherein said modifying step includes the steps of dividing said standard circuit information into a plurality of pieces of standard circuit block information that are associated with a plurality of standard circuit blocks, respectively, while defining as boundaries said one or more sequential circuits on which said ideal clock signal condition is imposed, and at least either of said one or more tristate buffers on each of which said first ideal assertion period condition is imposed and said one or more other sequential circuits on each of which said second ideal assertion period condition is imposed; and modifying each of said plurality of pieces of standard circuit block information so that each of said plurality of pieces of standard circuit block information satisfies said ideal clock signal condition and at least either of said first and second ideal assertion period conditions, and wherein in said outputting step said modified circuit information including a combination of said plurality of pieces of modified standard circuit block information is furnished.

10. The computer-implemented logic synthesis method according to claim 9, wherein said modifying step includes the step of modifying said one piece of standard circuit block information associated with one circuit block located between either a tristate buffer on which said first ideal assertion period condition is imposed or a sequential circuit on which said second ideal assertion period condition is imposed and another sequential circuit located upstream from either said tristate buffer or said former sequential circuit for furnishing a control signal to either said tristate buffer or said former sequential circuit in response to said clock signal so that said piece of standard circuit block information satisfies a maximum delay time condition defining a maximum value of a time delay to be provided to said control signal with respect to said clock signal.

11. The computer-implemented logic synthesis method according to claim 8, wherein in said modifying step, said standard circuit information is modified so that said standard circuit information satisfies said ideal clock signal condition and said first and second ideal assertion period conditions.

12. The computer-implemented logic synthesis method according to claim 11, wherein said modifying step includes the steps of dividing said standard circuit information into a plurality of pieces of standard circuit block information that are associated with a plurality of standard circuit blocks, respectively, while defining as boundaries said one or more sequential circuits on which said ideal clock signal condition is imposed, said one or more tristate buffers on each of which said first ideal assertion period condition is imposed, and said one or more other sequential circuits on each of which said second ideal assertion period condition is imposed; and modifying each of said plurality of pieces of standard circuit block information so that each of said plurality of pieces of standard circuit block information satisfies said ideal clock signal condition and said first and second ideal assertion period conditions, and wherein in said outputting step said modified circuit information including a combination of said plurality of pieces of modified standard circuit block information is furnished.

13. The computer-implemented logic synthesis method according to claim 12, wherein said modifying step includes the step of modifying said one piece of standard circuit block information associated with one circuit block located between a tristate buffer on which said first ideal assertion period condition is imposed and a sequential circuit located upstream from said tristate buffer for furnishing a control signal to said tristate buffer in response to said clock signal so that said piece of standard circuit block information satisfies a maximum delay time condition defining a maximum value of a time delay to be provided to said control signal with respect to said clock signal.

14. The computer-implemented logic synthesis method according to claim 12, wherein said modifying step includes the step of modifying said one piece of standard circuit block information associated with one circuit block located between a sequential circuit on which said second ideal assertion period condition is imposed and another sequential circuit located upstream from said former sequential circuit for furnishing a control signal to said former sequential circuit in response to said clock signal so that said piece of standard circuit block information satisfies a maximum delay time condition defining a maximum value of a time delay to be provided to said control signal with respect to said clock signal.

15. A logic synthesis apparatus for generating information about a constitution of target circuitry based on specifications of the target circuitry written in a hardware description language, comprising:

storage means for storing said specifications of the target circuitry, an ideal clock signal condition defining an ideal clock signal to be applied to one or more sequential circuits included in said target circuitry, and at least either of a first ideal assertion period condition defining an ideal period of time during which each of one or more tristate buffers included in said target circuitry is asserted and a second ideal assertion period condition defining an ideal period of time during which each of one or more other sequential circuits each for latching an output of a tristate buffer, which are included in said target circuitry is asserted;

standard design means for generating standard circuit information about said target circuitry based on said specifications stored in said storage means, said standard circuit information logically matching said specifications;

timing design means for generating modified circuit information by modifying said standard circuit information so that said standard circuit information satisfies both said ideal clock signal condition and at least either of said first and second ideal assertion period conditions; and output means for outputting said modified circuit information.

16. The logic synthesis apparatus according to claim 15, wherein said timing design means divides said standard circuit information into a plurality of pieces of standard circuit block information that are associated with a plurality of standard circuit blocks, respectively, while defining as boundaries said one or more sequential circuits on which said ideal clock signal condition is imposed, and at least either of said one or more tristate buffers on each of which said first ideal assertion period condition is imposed and said one or more other sequential circuits on each of which said second ideal assertion period condition is imposed, and then modifies each of said plurality of pieces of standard circuit block information so that each of said plurality of pieces of standard circuit block information satisfies both said ideal clock signal condition and at least either of said first and second ideal assertion period conditions, and wherein said output means furnishes said modified circuit information including a combination of said plurality of pieces of modified standard circuit block information.

17. The logic synthesis apparatus according to claim 16, wherein said timing design means modifies said one piece of standard circuit block information associated with one circuit block located between either a tristate buffer on which said first ideal assertion period condition is imposed or a sequential circuit on which said second ideal assertion period condition is imposed and another sequential circuit located upstream from said former sequential circuit for furnishing a control signal to said former sequential circuit in response to said clock signal so that said piece of standard circuit block information satisfies a maximum delay time condition defining a maximum value of a time delay to be provided to said control signal with respect to said clock signal.

18. The logic synthesis apparatus according to claim 15, wherein said timing design means modifies said standard circuit information so that said standard circuit information satisfies said ideal clock signal condition and said first and second ideal assertion period conditions.

19. The logic synthesis apparatus according to claim 18, wherein said timing design means divides said standard circuit information into a plurality of pieces of standard circuit block information that are associated with a plurality of standard circuit blocks, respectively, while defining as boundaries said one or more sequential circuits on which said ideal clock signal condition is imposed, said one or more tristate buffers on each of which said first ideal assertion period condition is imposed, and said one or more other sequential circuits on each of which said second ideal assertion period condition is imposed, and then modifies each of said plurality of pieces of standard circuit block information so that each of said plurality of pieces of standard circuit block information satisfies said ideal clock signal condition and said first and second ideal assertion period conditions, and wherein said output means furnishes said modified circuit information including a combination of said plurality of pieces of modified standard circuit block information.

20. The logic synthesis apparatus according to claim 19, wherein said timing design means includes means for modifying said one piece of standard circuit block information associated with one circuit block located between a tristate buffer on which said first ideal assertion period condition is imposed and a sequential circuit located upstream from said tristate buffer for furnishing a control signal to said tristate buffer in response to said clock signal so that said piece of standard circuit information satisfies a maximum delay time condition defining a maximum value of a time delay to be provided to said control signal with respect to said clock signal, and for modifying said one piece of standard circuit block information associated with one circuit block located between a sequential circuit on which said second ideal assertion period condition is imposed and another sequential circuit located upstream from said former sequential circuit for furnishing a control signal to said former sequential circuit in response to said clock signal so that said piece of standard circuit information satisfies a maximum delay time condition defining a maximum value of a time delay to be provided to said control signal with respect to said clock signal.

* * * * *